United States Patent [19]
Cleveland et al.

[11] Patent Number: 5,708,387
[45] Date of Patent: Jan. 13, 1998

[54] FAST 3-STATE BOOSTER-CIRCUIT

[75] Inventors: Lee E. Cleveland, Santa Clara; Johnny C. Chen, Cupertino, both of Calif.

[73] Assignee: Advanced Micro Devices, Inc., Sunnyvale, Calif.

[21] Appl. No.: 560,459

[22] Filed: Nov. 17, 1995

[51] Int. Cl.[6] ........................................ G05F 1/10
[52] U.S. Cl. .......................... 327/536; 327/544; 327/589; 365/204; 365/227
[58] Field of Search ............................ 327/589, 536, 327/537, 544, 108; 365/203, 204, 227

[56] References Cited

U.S. PATENT DOCUMENTS 4,580,067  4/1986  Proebsting et al. ................. 327/589
5,576,708  11/1996  De Wit ................................. 341/118

*Primary Examiner*—Timothy P. Callahan
*Assistant Examiner*—Jung Ho Kim
*Attorney, Agent, or Firm*—Davis Chin

[57] ABSTRACT

A voltage booster circuit includes a driver circuit (117) for generating a 3-state output for driving wordlines via row decoder circuits in an array of flash EEPROM memory cells during read and programming modes of operation. The driver circuit effectively disconnects a large booster capacitor (115) in order to allow a small charge pump (114) to further pump up the wordline voltage during programming. As a result, the booster pump has improved efficiency since there is achieved a significant reduction in power consumption.

20 Claims, 4 Drawing Sheets

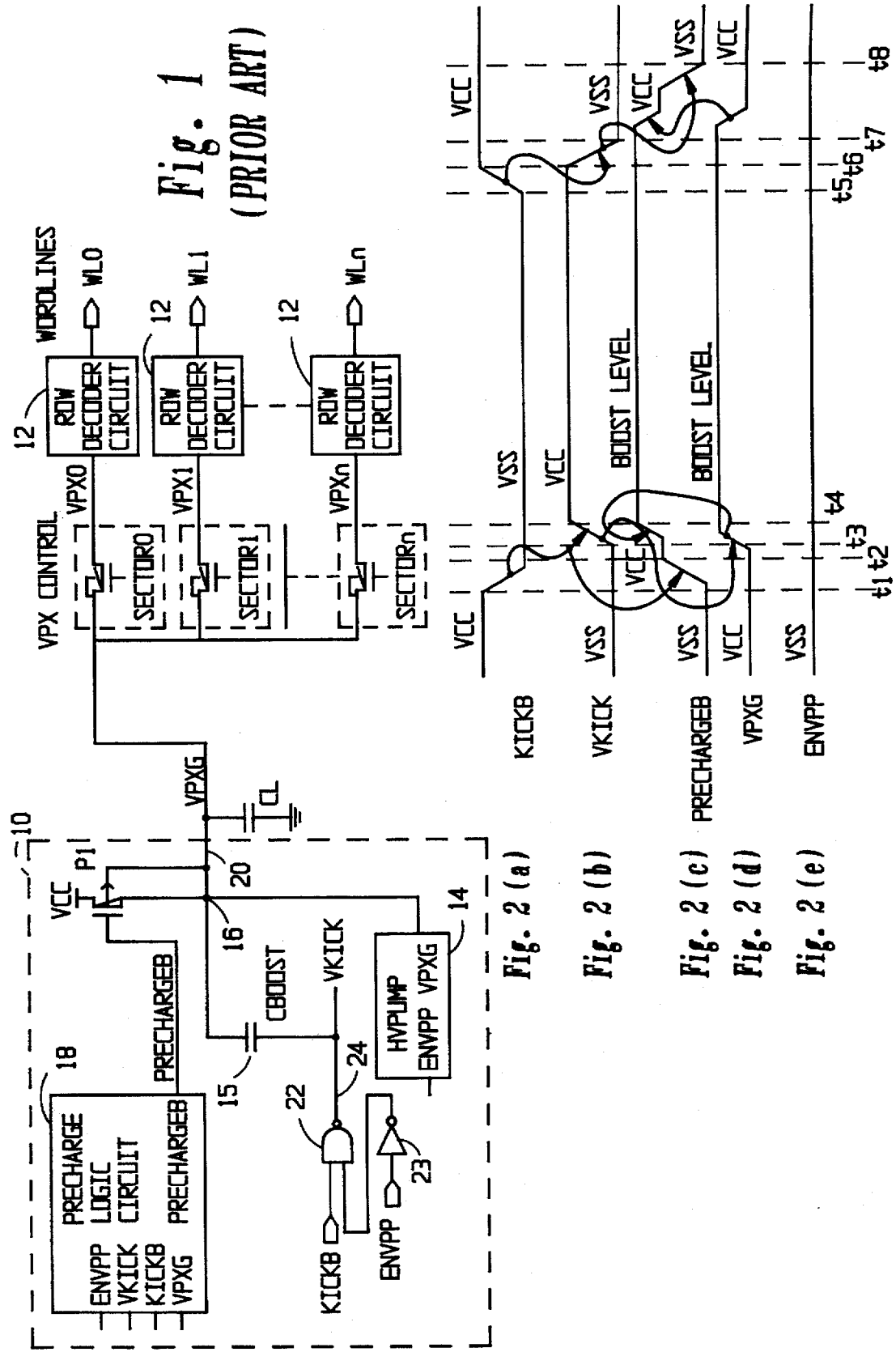

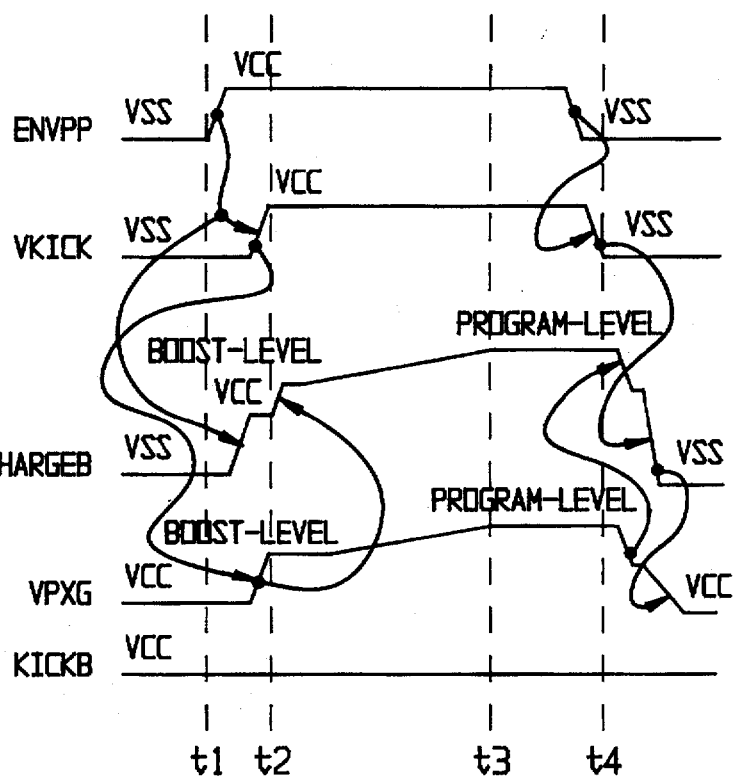
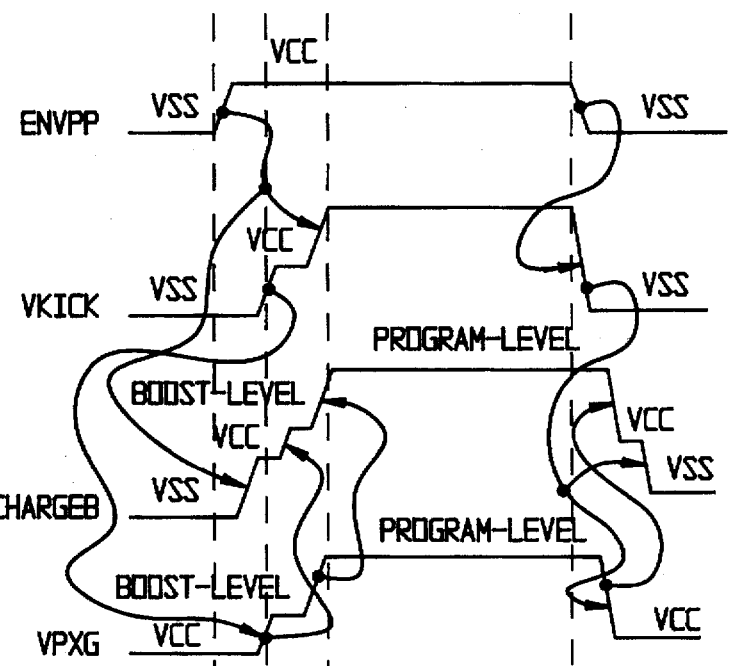

FAST 3-STATE BOOSTER-CIRCUIT

BACKGROUND OF THE INVENTION

1. Field of the Invention

This invention relates generally to voltage booster circuits and more particularly, it relates to an improved voltage booster circuit which includes a driver circuit for generating a three-state output to drive wordlines via row decoder circuits in an array of flash EEPROM memory cells during read and programming modes of operation.

2. Description of the Prior Art

As is generally known in the area of memory devices and other semiconductor integrated circuits, there is often required voltages to be internally generated that are greater than an external or off-chip power supply potential which is supplied to it. For example, it is known in flash electrically erasable, programmable read-only memories (EEPROM's) a first high voltage of approximately +5.0 volts is needed to be produced for the reading mode of operation of memory cells. Also, a second higher voltage of approximately +10.0 volts is needed to be produced for the programming mode of operation of the flash memory cells. As a consequence, the semiconductor memories also generally include one or more internal voltage boosting circuits for generating output signals boosted to be higher than an external supply voltage.

In FIG. 1, there is shown a simplified block diagram of a prior art voltage boosting circuit 10 for generating a wordline supply voltage VPXG, which is passed to appropriate wordlines $WL_0$-$WL_n$ in a memory array via respective row decoder circuits 12. The voltage boosting circuit 10 includes a high voltage charge pump 14 which is used during the programming mode of operation of the memory devices. The charge pump serves to charge up the wordline voltage VPXG at the internal wordline supply node 16 to approximately 10 volts when the enable signal ENVPP is high. The boosting circuit 10 also includes a precharge logic circuit 18 which functions to precharge the wordline voltage VPXG to the external power supply potential VCC before the same is boosted or pumped to a high voltage. The precharge logic circuit 18 will also maintain the supply voltage VPXG equal to the external power supply voltage VCC in other modes of operation via the P-channel pull-up transistor P1. The capacitor $C_L$ represents the capacitive loading of the row decoder circuits 12 and all of the parasitic capacitance associated with the lead line 20 connected to the wordline supply node 16.

With reference to FIGS. 2(a) through 2(e), the operation of the voltage boosting circuit 10 depicted in FIG. 1 will now be explained. Initially, it is assumed that prior to time t1 the enable signal ENVPP and the precharge bar signal PRECHARGEB are both low (VSS) and that the kick bar signal KICKB is high (VCC). Thus, the output of the NAND logic gate 22 on line 24 defining the kick voltage VKICK will be low (VSS). Further, the wordline supply voltage VPXG at the supply node 16 will be at the power supply potential VCC since the P-channel pull-up transistor P1 will be turned on.

When the kick bar signal KICKB makes a high-to-low transition at the time t1 as shown in FIG. 2(a), the precharge bar signal PRECHARGEB in FIG. 2(c) will be pulled to the power supply potential VCC at time t2. At time t3, the kick voltage VKICK will begin making a low-to-high transition, as depicted in FIG. 2(b). This will, in turn, cause the wordline supply voltage VPXG at the supply node 16 to be raised or bootstrapped by the signal VKICK via the booster capacitor 15 ($C_{BOOST}$) to the boosted level at the time t3 in FIG. 2(d). As a result, the precharge bar signal PRECHARGEB will be further raised to the boosted level at time t4 as shown in FIG. 2(c).

This boosted level of the wordline supply voltage VPXG can be calculated from the following equation:

$$VPXG_{BOOST} = VPXG_{init} + \frac{C_{BOOST}}{C_{BOOST}+C_L} \times VKICK \tag{1}$$

where:

$$VKICK = \text{Power supply potential VCC} \tag{2}$$

$$VPXG_{init} = \text{Power supply potential VCC} \tag{3}$$

By substituting equation (2) and (3) into equation (1) and simplifying, there is given:

$$VPXG_{BOOST} = VCC \left(1 + \frac{C_{BOOST}}{C_{BOOST}+C_L}\right) \tag{4}$$

From above equation (4), it can be seen that if the required maximum for the wordline voltage VPXG is less than the level that can be generated by the voltage boosting circuit 10 of FIG. 1, then the prior art boosting circuit 10 will be able to operate adequately. Unfortunately, as previously pointed out, the wordline supply voltage VPXG is typically required to be pumped up to approximately +10 V for the programming mode of operation of the flash memory cells. Therefore, under these circumstances, an additional means is required for producing this higher voltage, such as a second higher voltage charge pump.

However, the use of the prior art voltage boosting circuit 10 for this purpose is impractical since the total capacitance that is seen by the high voltage charge pump 14 is very high since the boost capacitor 15 is constantly connected to the kick signal VKICK which is either at VCC or ground. As a result, this prior art voltage boosting circuit 10 suffers from the disadvantage that either the charge pump 14 would require a much longer time in order to raise the voltage VPXG to the necessary programming level or the size of the charge pump 14 must be increased so as to raise the voltage VPXG to the necessary programming level in the same amount of time. The first way would increase the programming time, and the second way would increase the cost and complexity of the overall memory device. Thus, neither of these choices offer a satisfactory solution.

More specifically, this problem of the prior art having a high total capacitance can be illustrated by referring back to equation (2) above. If we let $VPXG_{min}$ be equal to the minimum VPX supply voltage required for the read mode of operation for a flash memory cell and let $VCC_{min}$ be equal to the minimum VCC power supply voltage of the flash memory cell, then we have through substitution:

$$VPXG_{min} = VCC_{min} \left(1 + \frac{C_{BOOST}}{C_{BOOST}+C_L}\right) \tag{5}$$

Further, by assuming $VPXG_{min}$ to be equal to +4.2 volts and $VCC_{min}$ to be equal to +2.6 volts, there is given:

$$4.2 = 2.6 \left(1 + \frac{C_{BOOST}}{C_{BOOST}+C_L}\right) \tag{6}$$

By solving for the booster capacitor $C_{BOOST}$, there is given:

$$\frac{4.2}{2.6} - 1 = \frac{C_{BOOST}}{C_{BOOST} + C_L} \text{ or} \tag{7}$$

$$C_{BOOST} = 1.60 \, C_L$$

Therefore, the total capacitance has been shown to have increased due to the booster capacitor as follows:

$$\begin{aligned} C_{TOTAL} &= C_{BOOST} + C_L \text{ or} \\ &= 2.60 \, C_L \end{aligned} \tag{8}$$

Accordingly, it would be desirable to provide an improved voltage booster circuit which overcomes the disadvantages of the prior art so as to be capable of operating efficiently and effectively in a low supply voltage environment. It would be expedient that the voltage booster circuit be operated effectively so as to produce a significant reduction in power dissipation. The present invention provides an improved voltage booster circuit which includes a driver circuit for generating three-state outputs so as to effectively disconnect the large booster capacitor in order to allow a small charge pump to further pump up the wordline voltage during programming.

SUMMARY OF THE INVENTION

Accordingly, it is a general object of the present invention to provide an improved voltage booster circuit which overcomes all of the disadvantages of the prior art boosting circuits.

It is an object of the present invention to provide an improved voltage booster circuit which is capable of operating efficiently and effectively in a low supply voltage environment.

It is another object of the present invention to provide an improved voltage booster circuit which can be operated efficiently so as to produce a significant reduction in power dissipation.

It is yet still another object of the present invention to provide an improved voltage booster circuit which includes a driver circuit for generating a three-state output so as to effectively disconnect the large booster capacitor in order to allow a small charge pump to further pump up the wordline voltage during programming.

In accordance with these aims and objectives, the present invention is concerned with the provision of an improved voltage booster circuit for generating at a wordline supply node a supply voltage boosted to be higher than a power supply potential for driving wordlines via row decoder circuits in an array of flash EEPROM memory cells during read and programming modes of operation. The voltage booster circuit includes a precharging transistor means which is responsive to a precharge signal for selectively connecting the power supply potential to the wordline supply node. Charge pump means is responsive to an enable signal for pumping up the wordline supply voltage to a higher wordline supply voltage defining a program level during a programming mode. A driver circuit is used to selectively generate a three-state output voltage at an output node so as to drive a booster capacitor. The booster capacitor is interconnected between the output node of the driver circuit means and the wordline supply node.

The driver circuit means generates the three-state output voltage which is at a low state during a precharge mode, at a high state during a read mode, and at a high impedance state during the programming mode. The driver circuit effectively disconnects the booster capacitor from the wordline supply node when the three-state output voltage is at the high impedance state so as to reduce the capacitive loading on the charge pump means. The high voltage charge pump means boosts subsequently the wordline supply node to the program level after the output voltage of the driver circuit means is in the high impedance state.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein:

FIG. 1 is a simplified block diagram of a prior art voltage boosting circuit;

FIGS. 2(a)–2(e) are timing diagrams of the voltages at various points in the circuit of FIG. 1 during a read mode of operation;

FIGS. 3(a)–3(e) are timing diagrams of the voltages at various points in the circuit of FIG. 1 during a programming mode of operation;

FIGS. 7(a)–7(e) are timing diagrams of the voltages at various points in the circuit of FIG. 4 during a programming mode of operation;

DESCRIPTION OF THE PREFERRED EMBODIMENTS

Figure 4:
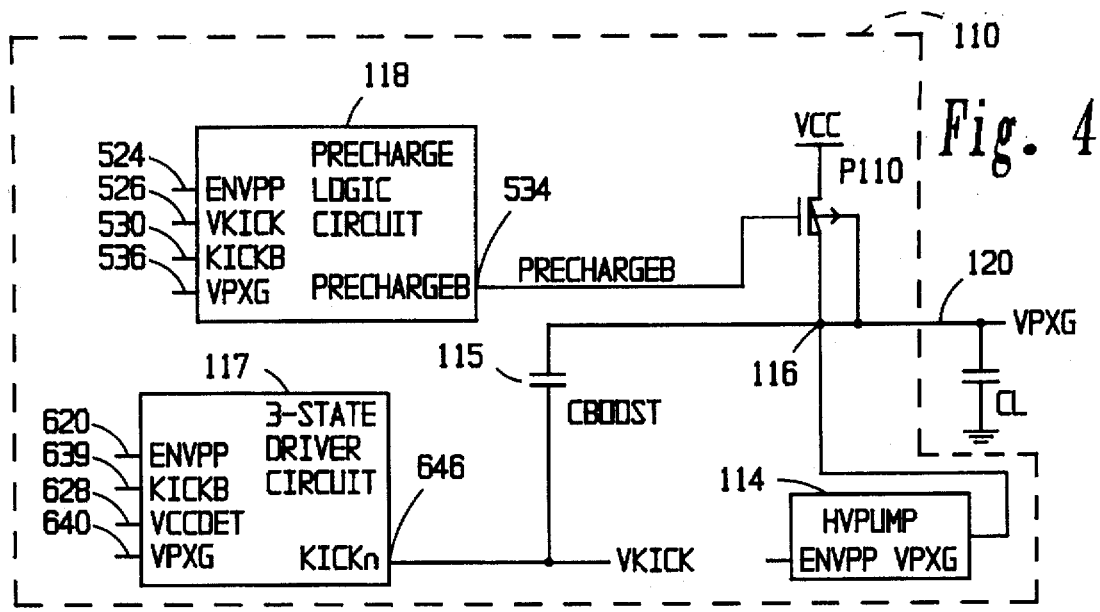
FIG. 4 is a simplified block diagram of a fast, three-state booster circuit, constructed in accordance with the principles of the present invention.

In the following, there will be described preferred embodiments of the present invention with reference to the drawings. There is illustrated in FIG. 4 of the drawings a simplified block diagram of an improved voltage booster circuit 110, constructed in accordance with the principles of the present invention. The voltage booster circuit 110 is quite similar in its construction to the boosting circuit 10 of FIG. 1. The main difference is that the NAND gate 22 and the inverter 23 in FIG. 1 have now been replaced by a three-state driver circuit.

In particular, the present voltage booster circuit 110 is comprised of a high voltage charge pump 114, a precharge logic circuit 118, a P-channel pull-up transistor P110, a booster capacitor 115 ($C_{BOOST}$) and the three-state driver circuit 117. Similarly, the capacitor $C_L$ represents the capacitive loading of the row decoder circuits (as shown in FIG. 1) and all of the parasitic capacitance associated with a lead line 120 connected to a wordline supply node 116 for generating the wordline supply voltage VPXG. The driver circuit 117 has an output which is used to drive the booster capacitor 115. The output of the driver circuit 117 has three states: (1) a low state during a precharge mode, (2) a high state during a read mode, and (3) a high impedance state during a programming mode. The driver circuit serves to effectively disconnect the booster capacitor 115 from the supply node 116 during programming, thereby reducing the capacitive loading on the high voltage charge pump 114.

Figure 5:
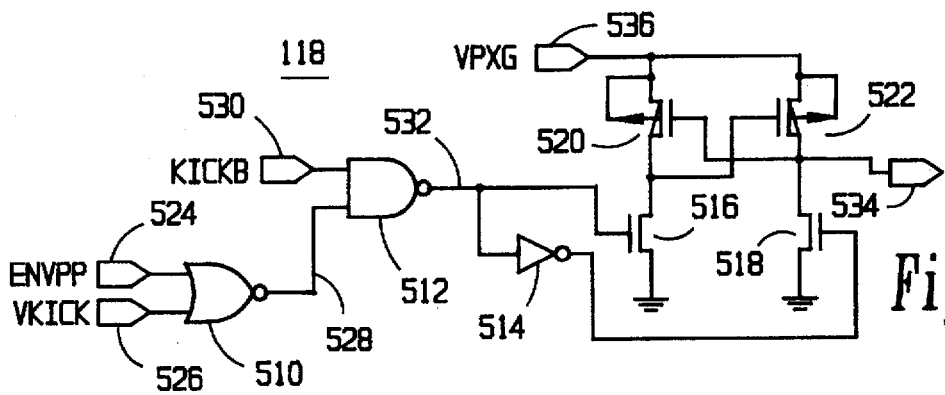
FIG. 5 is a detailed schematic circuit diagram of the precharge logic circuit of FIG. 4.

In FIG. 5, there is shown a detailed schematic circuit diagram of the precharge logic circuit 118 of FIG. 4. The precharge logic circuit includes a NOR gate 510, a NAND gate 512, an inverter 514, a pair of N-channel input transistors 516, 518, and a pair of P-channel load transistors 520, 522. The NOR gate 510 has a first input node 524 for receiving an enable signal ENVPP and a second input node 526 for receiving a kick signal VKICK. The output of the NOR gate 510 on line 528 is fed to a first input of NAND gate 512. The other input of the NAND gate 512 is at node 530 for receiving a kick bar signal KICKB. The output of the NAND gate 512 on line 532 is fed to the gate of the input transistor 516 and to the gate of the input transistor 518 via the inverter 514. The drain of the input transistor 516 is joined to the drain of the load transistor 520 and to the gate of the load transistor 522. The drain of the input transistor 518 is joined to the drain of the load transistor 522, to the gate of the load transistor 520, and to an output node 534 for generating the precharge bar signal PRECHARGEB. The sources of the input transistors 516 and 518 are connected to the ground potential VSS. The sources of the load transistors 520 and 522 are connected together and to an input node 536 for receiving the wordline supply voltage VPXG.

Figure 6:
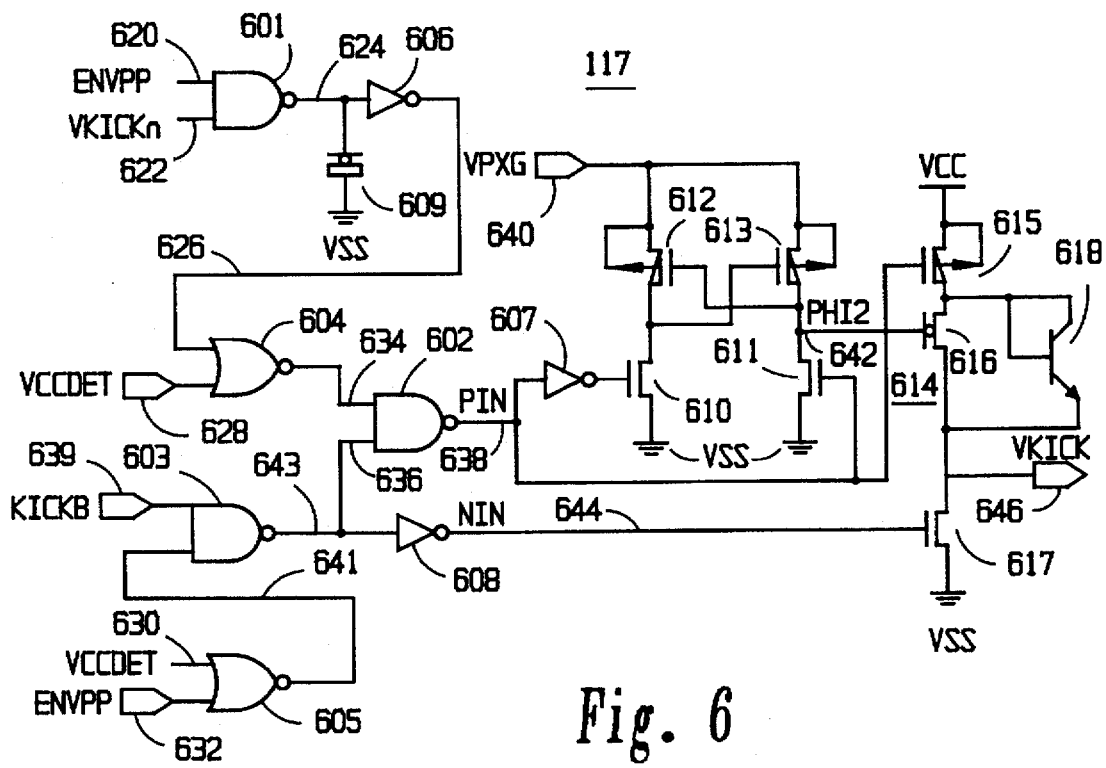
FIG. 6 is a detailed schematic circuit diagram of the three-state driver circuit of FIG. 4.

A detailed schematic circuit diagram of the three-state driver circuit 117 of FIG. 4 is depicted in FIG. 6. The driver circuit includes NAND gates 601, 602, 603; NOR gates 604, 605; inverters 606, 607, 608; a capacitor-connected N-channel transistor 609; a pair of N-channel input transistors 610, 611; a pair of P-channel load transistors 612, 613; and an output stage 614. The output stage 614 includes a large P-channel pull-up transistor 615, an N-channel intrinsic pull-up transistor 616, a large N-channel pull-down transistor 617, and a diode-connected bipolar junction transistor 618.

The NAND gate 601 has a first input node on line 620 for receiving the enable signal ENVPP and second input on line 622 for receiving the kick signal VKICK which is fed back from the output stage 614. The output of the NAND gate 601 on line 624 is fed to the input of the inverter 606 and to one side of the capacitor 609. The other side of the capacitor 609 is connected to the ground potential VSS. The NOR gate 604 has a first input on line 626 which is connected to the output of the inverter 606 and a second input on line 628 for receiving a detected signal VCCDET. The NOR gate 605 has a first input on line 630 for receiving also the detected signal VCCDET and a second input on input node 632 for receiving the enable signal ENVPP.

The NAND gate 602 has a first input connected to the output of the NOR gate 604 via line 634 and a second input connected to the output of the NAND gate 603 via line 636. The NAND gate 603 has a first input on input node 639 for receiving a kick bar signal KICKB and a second input connected to the output of the NOR gate 605 via line 641. The output of the NAND gate 603 on line 643 is also connected to the input of the inverter 608. The output of the NAND gate 602 on line 638 (PIN) is fed to the gate of the input transistor 610 via the inverter 607 and to the gate of the input transistor 611. The drain at the input transistor 610 is joined to the drain of the load transistor 612 and to the gate of the load transistor 613. The drain of the input transistor 611 is joined to the drain of the load transistor 613 and to the gate of the load transistor 612. The sources of the input transistors 610 and 611 are connected together and to the ground potential VSS. The sources of the load transistors 612 and 613 are connected together and to an input node 640 for receiving the wordline supply voltage VPXG.

The P-channel pull-up transistor 615 has its source connected to the power supply potential VCC, its gate connected to the output of the NAND gate 602 on the line 638, and its drain connected to the drain of the N-channel intrinsic pull-up transistor 616. The gate of the intrinsic transistor 616 is connected to the common drains of the transistors 611 and 613 on line 642 (PHI2). The N-channel pull-down transistor 617 has its drain connected to the source of the intrinsic transistor 616, its gate connected to the output of the inverter 608 on line 644 (NIN), and its source connected to the ground potential VSS. The bipolar transistor 618 has its base and collector connected together and to the drain of the intrinsic transistor 616 and has its emitter connected to the source thereof. The drain of the N-channel pull-down transistor 617 is also connected to an output node 646 for generating the kick signal VKICK.

The read operation of the voltage booster circuit 110 depicted in FIGS. 4–6 will now be explained with reference to the waveforms in FIGS. 2(a)–2(e). Again, it will be assumed that prior to the time t1, the enable signal ENVPP is low (VSS) and the kick bar signal KICKB is high (VCC). Also, the detected signal VCCDET is assumed to be low (VSS). Thus, the output of the NOR gate 605 (FIG. 6) on line 641 will be high which causes the output of the NAND gate 603 on the line 643 to be low. As a result, the output (NIN) of the inverter 608 will be high so as to turn on the pull-down transistor 617, thereby making the kick signal VKICK low (VSS) as shown in FIG. 2(b). Simultaneously, the output (PIN) of the NAND gate 602 will be high which turns on the transistor 611, thereby turning off the intrinsic transistor 616 since the node PHI2 is low. Further, this will in turn cause the output of the NOR gate 510 (FIG. 5) to be high and the output of the NAND gate 532 to be low. Therefore, the input transistor 518 will be turned on so as to pull the precharge bar signal PRECHARGEB on the line 534 low, as illustrated in FIG. 2(c). This will cause the P-channel pull-up transistor P110 (FIG. 4) to be rendered conductive, thereby forcing the wordline supply voltage VPXG to be at VCC as shown in FIG. 2(d). Also, it will be noted that since the input transistor 516 is non-conductive and the load transistor 520 is conductive, the load transistor 522 will be turned off.

In order to initiate a read operation, the kick bar signal will make a high-to-low transition at the time t1, as shown in FIG. 2(a). This causes the output (NIN) of the inverter 608 (FIG. 6) to switch low, thereby turning off the pull-down transistor 617. Simultaneously, the output (PIN) of the NAND gate 602 switches low, turning on the pull-up transistor 615 which begins to pull the kick signal VKICK up to one threshold voltage drop $V_{be}$ below the power supply potential VCC (VCC-$V_{be}$) at the time t3 in FIG. 2(b). Further, the switching of the output (PIN) low will cause the input transistor 611 to turn off and the load transistor to turn on. Consequently, the gate of the intrinsic transistor 616 will be tied to the supply voltage VPXG, which is at the time t3 being boosted by the kick signal VKICK. This is depicted in FIG. 2(d). Therefore, the intrinsic transistor 616 allows the kick signal VKICK to be finished pulling up to the full power supply potential VCC, as shown in FIG. 2(b). Also, the precharge bar signal will be pulled to the boosted level at the time t4 via the load transistor 522 (FIG. 5), as shown in FIG. 2(c).

Prior to the programming operation, the kick bar signal will make a low-to-high transition, such as at time t5 in FIG.

2(a). This will cause the output (NIN) of the inverter 608 to switch high so as to turn on the pull-down transistor 617, thereby pulling the kick signal VKICK low at time t6 in FIG. 2(b). Since the wordline supply voltage VPXG is capacitively coupled to the kick signal VKICE, it will also begin to drop at time t7 as shown in FIG. 2(d). Further, as the wordline supply voltage VPXG drops to the VCC level, the load transistor 522 will be turned off allowing the intrinsic transistor 616 to finish pulling the kick signal VKICK and the precharge bar signal to the ground potential VSS at the times t7 and t8, as depicted in FIGS. 2(b) and 2(c).

As a background and in order to provide an understanding of the differences in operation of the present voltage booster circuit in the programming mode, the programming operation for the prior art boosting circuit 10 in FIG. 1 will be first explained with reference to FIGS. 3(a)–3(e). It will be assumed that prior to the start of programming (before t1) the enable signal ENVPP, kick signal VKICK, and precharge signal PRECHARGEB are all low (VSS) and the wordline voltage VPXG and the kick bar signal KICKB are both high (VCC).

In order to initiate a program operation in FIG. 1, the enable signal ENVPP makes a low-to-high transition at the time t1 in FIG. 3(a). The enable signal ENVPP triggers the kick signal VKICK so as to boost the wordline voltage VPXG to the boosted level at time t2 as shown in FIG. 3(d). Also, the load transistor 522 will be turned on so as to cause the precharge signal, which is now tied to the wordline voltage VPXG to switch to the VCC level at the time t2, as shown in FIG. 3(c). The enable signal ENVPP also turns on the high voltage charge pump 14 which will then further charge the wordline voltage VPXG up to the program level, as illustrated at time t3 in FIG. 3(d). Since the kick signal VKICK is tied to the power supply potential VCC, the full booster capacitor 15 ($C_{BOOST}$) will remain connected to the wordline voltage VPXG. As a result, the charge pump 14 is required to produce a more substantial amount of charge in order to raise the wordline voltage VPXG to the program level between the times t2 to t3 in FIG. 3(d). In comparison, the programming operation of the present invention voltage booster circuit of FIGS. 4 through 6 will now be explained with attention directed to FIGS. 7(a)–7(e). Accordingly, in order to initiate a program operation, the enable signal ENVPP makes a low-to-high transition at time t1a in FIG. 7(a). This causes the kick signal VKICK to begin being pulled to the VCC level at time t2a in FIG. 7(b). At this time t2a, the kick signal VKICK, which is fed back to the NAND gate 601, will cause the output (PIN) of the NAND gate 602 to switch high (VCC). This will, in turn, cause the input transistor 611 to be rendered conductive, thereby turning off the intrinsic transistor 616. As a result, the kick signal VKICK is disconnected or isolated from the power supply potential VCC. Therefore, the driver has now been placed into a high impedance state. Unlike the prior art of FIG. 3(b), the kick signal VKICK will now be able to follow the wordline voltage VPXG between the times t2a to t3a, as illustrated in FIGS. 7(b) and 7(d) up to the program level.

Further, as can best be seen from FIG. 7(b) at time t4a when the kick signal VKICK is switched back to the low level (VSS), the pull-up transistor Pl10 will be quickly turned on so as to pull down the wordline voltage VPXG to the VCC level, thereby minimizing the amount of current required to precharge the wordline voltage VPXG. In the prior art of FIG. 3(b), a much larger change in the signal VKICK is required so as to discharge through the precharge device. As will be noted at time t4 in FIG. 3(d), the wordline voltage VPXG will decrease slowly to the VCC level.

Figure 8:
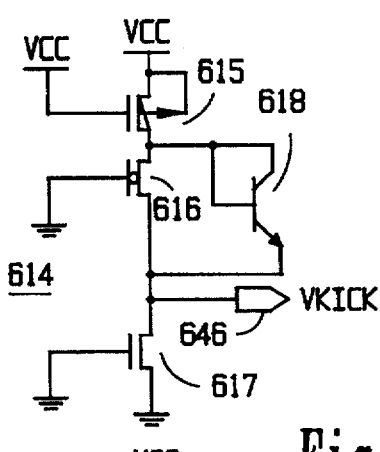
FIG. 8(a) is a schematic diagram of the output stage of the driver circuit of FIG. 6 during a high impedance state.
FIG. 8(b) is an equivalent capacitance circuit of the output stage of FIG. 8(a)
Figure 8:
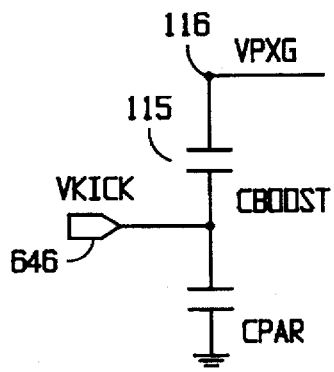

During the time that the driver circuit 117 is in the high impedance state, the large booster capacitor 115 (FIG. 4) will be effectively disconnected from the wordline supply node 116 so as to allow the high voltage charge pump 114 to continue boosting the wordline supply voltage VPXG up to the program level. By reducing the capacitive loading at the supply node 116, the high voltage charge pump 114 can be made smaller and yet still boost up the voltage to the program level in the same amount of time. Thus, the power dissipation can be significantly reduced. The output power of the driver circuit is given by the following expression:

$$P = C \times V^2 \times F \qquad (9)$$

where:
C=value of capacitor seen by driver circuit
V=magnitude of voltage switched across capacitor
F=frequency at which the voltage is being switched The reduction of the capacitive loading during the high impedance state can be best explained with reference to FIGS. 8(a) and 8(b). In FIG. 8(a), there is shown a schematic circuit diagram of the output stage 614 of the driver circuit 117 of FIG. 6 during the high impedance state. In FIG. 8(b), there is shown an equivalent capacitance circuit of the output stage 614 of FIG. 8(a). Since the transistors 615, 616 and 617 are all turned off, only the small gate overlap capacitance and the drain-to-source capacitances of the transistors 616 and 617 plus the parasitic of the booster capacitor $C_{BOOST}$ itself will be seen at the output node 646 in FIG. 8(a). This parasitic capacitance is represented by capacitor $C_{PAR}$ in FIG. 8(b). Therefore, the capacitor $C_{PAR}$ will be in series with the large booster capacitor $C_{BOOST}$ as seen from the supply node 116. Accordingly, the effective capacitance is given as follows:

$$C_{EFF} = \frac{C_{BOOST} \times C_{PAR}}{C_{BOOST} + C_{PAR}} \qquad (10)$$

If the value of the capacitor $C_{BOOST}$ is much larger than the value of the capacitor $C_{PAR}$, then the effective capacitance will be approximately equal to $C_{PAR}$. Consequently, the total capacitance $C_{TOTAL}$ will be equal $C_{PAR}+C_L$. Since the capacitor $C_{PAR}$ will typically be much smaller than the load capacitor $C_L$, the load capacitor $C_L$ will remain substantially the same, which is unlike the total capacitance of the prior art as shown from equation (8) above.

Referring again to equation (4) above, it can be seen that the minimum wordline voltage $VPXG_{BOOST(min)}$ required to insure that the memory cells are properly read is dependent upon the minimum power supply potential $VCC_{(min)}$. Thus, the booster capacitor $C_{BOOST}$ must be designed to have a capacitance size such that the minimum wordline voltage $VPXG_{BOOST(min)}$ is reached when the power supply potential is at a minimum ($VCC_{(min)}$). Further, it will be noted that the voltage variation in the wordline voltage $VPXG_{BOOST}$ is also dependent upon the variation in the power supply potential VCC and will be given as follows:

$$VPXG_{BOOST(VAR)} = (VCC_{MAX} - VCC_{min}) \times \left(1 + \frac{C_{BOOST}}{C_{BOOST} + C_L}\right) \qquad (11)$$

Figure 9:
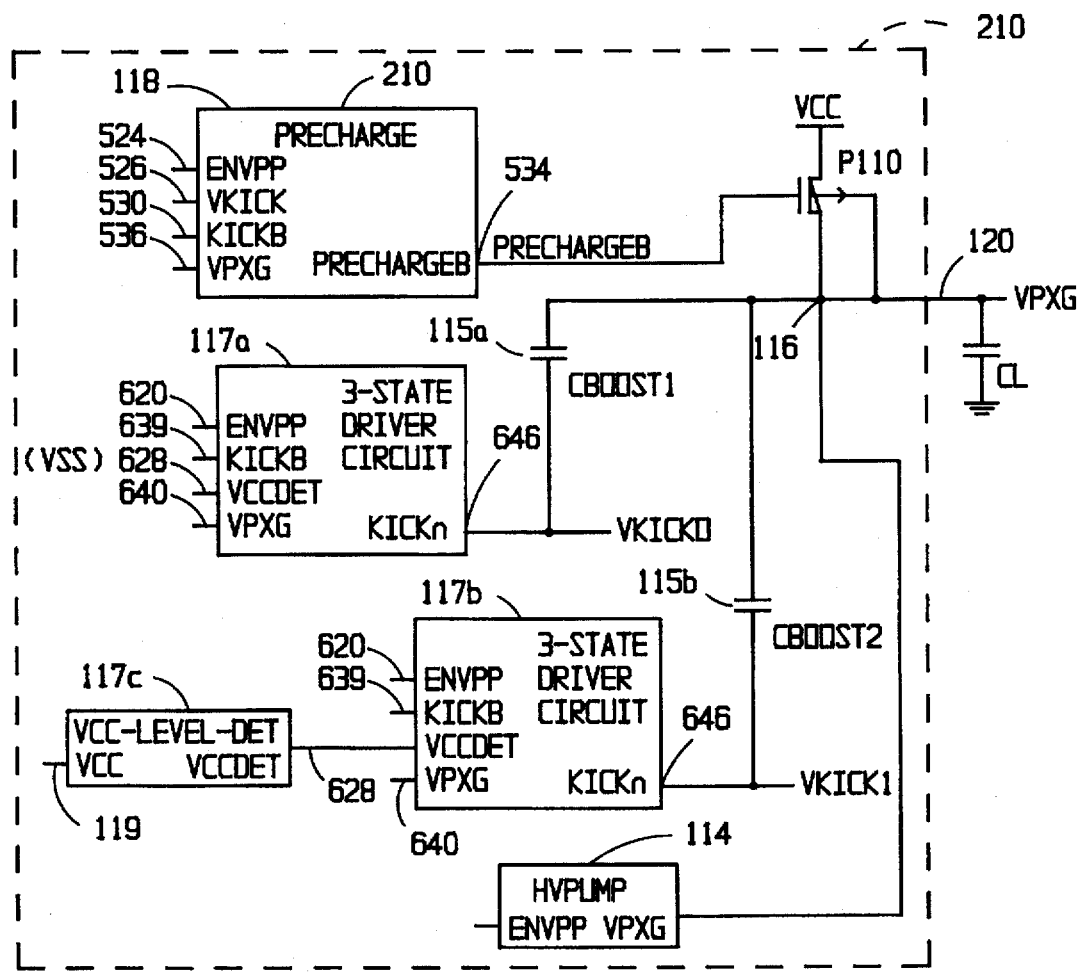
FIG. 9 is a simplified block diagram of a second embodiment of a fast, three-state booster circuit, constructed in accordance with the principles of the present invention.

Therefore, in order to reduce the voltage variation of the wordline voltage VPXG and the overall power dissipation of the voltage booster circuit 110, there is shown in FIG. 9 a block diagram of a second embodiment of an improved voltage booster circuit 210, constructed in accordance with the principles of the present invention. The voltage booster circuit 210 is substantially identical to the circuit 110 of FIG. 4. The main difference is that the three-state driver circuit 117 has been replaced by two 3-state driver circuits 117a and 117b and a VCC voltage detector circuit 117c. Also, the booster capacitor 115 ($C_{BOOST}$) has been split into two capacitors 115a ($C_{BOOST1}$) and 115b ($C_{BOOST2}$), where the original booster capacitor $C_{BOOST} = C_{BOOST1} + C_{BOOST2}$.

In particular, the voltage booster circuit 210 is comprised of the high voltage charge pump 114, the precharge logic circuit 118, the P-channel pull-up transistor P110, the two 3-state driver circuits 117a and 117b, and the two booster capacitors 115a ($C_{BOOST1}$) and 115b ($C_{BOOST2}$). The capacitor $C_L$ represents the capacitive load of the row decoder circuit (FIG. 1) and parasitic capacitance associated with lead line 120 connected to the wordline supply node 116. The output of the driver circuit 117a is used to drive the booster capacitor 115a, and the output of the driver circuit 117b is used to drive the booster capacitor 115b. The only difference in the input connections of the two driver circuits is that the second driver circuit 117b has its input node 628 connected to the output of the VCC detection circuit 117c rather than to the ground potential VSS. The output node VCCDET of the detector circuit 117c will go high when its input on line 119 senses that the VCC level has reached an intermediate level $VCC_{int}$. This will cause the driver circuit 117b to be switched to a high impedance state. As a result, the booster capacitor $C_{BOOST2}$ will be effectively disconnected from the supply node 116 so as to reduce the voltage variation in the wordline voltage VPXG as well as the power dissipation.

The voltage variations in the wordline supply voltage VPXG in FIG. 9 are given as follows:

For VCC<the intermediate voltage $VCC_{int}$, we have from above equation (11), $$VPXG_{BOOST(VAR)} = (VCC_{int} - VCC_{min}) \times \left(1 + \frac{C_{BOOST1} + C_{BOOST2}}{C_{BOOST1} + C_{BOOST2} + C_L}\right) \quad (12)$$

For VCC>the intermediate voltage $VCC_{int}$, we have again from above equation (11), $$VPXG_{BOOST(VAR)} = (VCC_{max} - VCC_{int})\left(1 + \frac{C_{BOOST1}}{C_{BOOST1} + C_L}\right) \quad (13)$$

where:

$C_{BOOST2}$ is effectively disconnected

Since ($VCC_{max} - VCC_{min}$) in equation (11) is greater than both ($VCC_{int} - VCC_{min}$) and ($VCC_{max} - VCC_{int}$) in respective equations (12) and (13), and since $C_{BOOST1} + C_{BOOST2}$ is greater than $C_{BOOST1}$, it follows therefore that the voltage variations of the wordline voltage $VPXG_{(VAR)}$ in equations (12) and (13) will be smaller than the one in equation (11). It should be apparent to those skilled in the art that the booster capacitors could be further subdivided down into any number of separate booster capacitors each driven by its own 3-state driver circuit, even though there is a limit to this number in practice. Likewise, the dividing down of the booster circuits will also reduce the power dissipation. As can be seen from equation (9) above, by making the capacitor associated with the driver circuit to be smaller this will decrease its power consumption.

Since the present booster circuit 110 is meant to have a fast operation the intrinsic pull-up transistor 616 would normally need to be quite large. However, by making the intrinsic transistor quite large this causes some drawbacks. First, it adds additional loading to the wordline supply node 116, thereby increasing the load capacitance Cn. If the load capacitance Cn increases, the booster capacitor $C_{BOOST}$ must also be increased for compensation, thereby increasing both the chip area and the power dissipation. Secondly, using a larger intrinsic device requires more buffering stages thus decreasing the speed and further adding to the power dissipation. Using the bipolar pull-up transistor 618 connected in parallel with the intrinsic pull-up device 616 allows the size of the intrinsic device to be greatly reduced since by the time the bipolar transistor pulls the kick signal VKICK up to $VCC - V_{be}$ the wordline supply voltage VPXG will already be partially boosted and the intrinsic transistor will have a higher gate-to-source voltage so as to bring the kick signal VKICK the rest of the way to the power supply potential VCC.

From the foregoing detailed description, it can thus be seen that the present invention provides an improved voltage booster circuit which includes a driver circuit for generating a 3-state output to drive wordlines via row decoder circuits in an array of flash EEPROM memory cells during read and program modes of operation. The present driver circuit is used to effectively disconnect the large booster capacitor in order to allow a small charge pump to further pump up the wordline voltage during programming. As a result, the driver circuit of the present invention has improved efficiency since there is achieved a significant reduction in power consumption.

While there has been illustrated and described what are at present considered to be preferred embodiments of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiments disclosed as the best modes contemplated for carrying out the invention, but that the invention will include all embodiments falling within the scope of the appended claims.

What is claimed is:

1. A voltage booster circuit for generating at a wordline supply node a supply voltage boosted to be higher than a power supply potential for driving wordlines via row decoder circuits in an array of flash EEPROM memory cells during read and program modes of operation, comprising:

precharging transistor means (P110) responsive to a precharge signal for selectively connecting the power supply potential to the wordline supply node;

charge pump means (114) responsive to an enable signal for pumping up the wordline supply node to a higher wordline supply voltage defining a program level during a programming mode;

driver circuit means (117) for selectively generating a 3-state output voltage at an output node to drive a booster capacitor (115);

said booster capacitor being interconnected between said output node of said driver circuit means and said wordline supply node;

said driver circuit means generating said 3-state output voltage which is at a low state during a precharge mode, at a high state during a read mode, and at a high impedance state during the programming mode;

said driver circuit means effectively disconnecting said booster capacitor from said wordline supply node when said 3-state output voltage is at the high impedance state so as to reduce the capacitive loading on said charge pumping means; and said pumping means boosting subsequently the wordline supply node to the program level after the output node of said driver circuit means is in the high impedance state.

2. A voltage booster circuit as claimed in claim 1, wherein said precharging transistor means includes a P-channel pull-up transistor (P110) having its source connected to the power supply potential, its gate connected to the precharge signal, and its drain connected to the wordline supply node.

3. A voltage booster circuit as claimed in claim 2, further comprising precharge logic circuit means (118) for generating said precharge signal which is at a low state so as to precharge said wordline supply node to the power supply potential prior to the read mode.

4. A voltage booster circuit as claimed in claim 1, wherein said charge pump means includes a high voltage charge pump (114).

5. A voltage booster circuit as claimed in claim 1, wherein said driver circuit means (117) includes an output stage (614) which is formed of a large P-channel pull-up transistor (615), an N-channel intrinsic transistor (616), and a large N-channel pull-down transistor (617) connected in series between the power supply potential and a ground potential (VSS).

6. A voltage booster circuit as claimed in claim 5, wherein said N-channel intrinsic transistor (616) is turned off so as to disconnect the power supply potential from the wordline supply node during the high impedance state.

7. A voltage booster circuit as claimed in claim 1, wherein said output voltage of said driver circuit means defines a kick signal which is at the high state so as to boost the wordline supply node to a boosted level during the read mode.

8. A voltage booster circuit as claimed in claim 5, further comprising a diode-connected bipolar junction transistor (618) having its base and collector connected together, said transistor being connected in parallel across said N-channel intrinsic transistor.

9. A voltage booster circuit for generating at a wordline supply node a supply voltage boosted to be higher than a power supply potential for driving wordlines which have a reduction in voltage variations at the wordline supply node and have less power dissipation, comprising:

precharging transistor means (P110) responsive to a precharge signal for selectively connecting the power supply potential to the wordline supply node;

charge pump means (114) responsive to an enable signal for pumping up the wordline supply node to a higher wordline supply voltage defining a program level during a programming mode;

a plurality of booster capacitors (115a, 115b) each having a first end and a second end, each of said first end of said plurality of booster capacitors being connected to said wordline supply node;

a plurality of driver circuits (117a, 117b) each selectively generating a 3-state output voltage at an output node, each output node being connected to a corresponding one of said second end of said plurality of booster capacitors;

each of said plurality of driver circuits generating said 3-state output voltage which is at a low state during a precharge mode, at a high state during a read mode, and at a high impedance state during the programming mode;

each of said plurality of driver circuits effectively disconnecting said associated booster capacitor from said wordline supply node when said 3-state output voltage is at the high impedance state so as to reduce the capacitive loading on said charge pumping means; and said pumping means boosting subsequently the wordline supply node to the program level after the output node of said driver circuit means is in the high impedance state.

10. A voltage booster circuit as claimed in claim 9, wherein said precharging transistor means includes a P-channel pull-up transistor (P110) having its source connected to the power supply potential, its gate connected to the precharge signal, and its drain connected to the wordline supply node.

11. A voltage booster circuit as claimed in claim 10, further comprising precharge logic circuit means (118) for generating said precharge signal which is at a low state so as to precharge said wordline supply node to the power supply potential prior to the read mode.

12. A voltage booster circuit as claimed in claim 9, wherein said charge pump means includes a high voltage charge pump (114).

13. A voltage booster circuit as claimed in claim 9, wherein each of said plurality of driver circuits (117) includes an output stage (614) which is formed of a large P-channel pull-up transistor (615), an N-channel intrinsic transistor (616), and a large N-channel pull-down transistor (617) connected in series between the power supply potential and a ground potential (VSS).

14. A voltage booster circuit as claimed in claim 13, wherein said N-channel intrinsic transistor (616) is turned off so as to disconnect the power supply potential from the wordline supply node during the high impedance state.

15. A voltage booster circuit as claimed in claim 9, wherein said output voltage of each of said plurality of driver circuits defines a kick signal which is at the high state so as to boost the wordline supply node to a boosted level during the read mode.

16. A voltage booster circuit as claimed in claim 13, further comprising a diode-connected bipolar junction transistor (618) having its base and collector connected together, said transistor being connected in parallel across said N-channel intrinsic transistor.

17. A voltage booster circuit for generating at a wordline supply node a supply voltage boosted to be higher than a power supply potential for driving wordlines via row decoder circuits in an array of flash EEPROM memory cells during read and program modes of operation, comprising:

precharging transistor means (P110) responsive to a precharge signal for selectively connecting the power supply potential to the wordline supply node;

charge pump means (114) responsive to an enable signal for pumping up the wordline supply node to a higher wordline supply voltage defining a program level during a programming mode;

a first driver circuit (117a) for selectively generating a 3-state output voltage at an output node to drive a first booster capacitor (115a);

a second driver circuit (117b) for selectively generating a 3-state output voltage at an output node to drive a second booster capacitor (115b);

said first booster capacitor (115a) being interconnected between said output node of said first driver circuit and said wordline supply node;

said second booster capacitor (115b) being interconnected between said output node of said second driver circuit and said wordline supply node;

a voltage detector circuit (117c) for generating a detected signal; and said second driver circuit being responsive to said detected signal for causing its output to be at a high impedance state during the programming mode so as to reduce the capacitive loading on said charge pump means.

18. A voltage booster circuit as claimed in claim 17, wherein each of said first and second driver circuits (117a, 117b) includes an output stage (614) which is formed of a large P-channel pull-up transistor (615), an N-channel intrinsic transistor (616), and a large N-channel pull-down transistor (617) connected in series between the power supply potential and a ground potential (VSS).

19. A voltage booster circuit as claimed in claim 18, further comprising a diode-connected bipolar junction transistor (618) having its base and collector connected together, said transistor being connected in parallel across said N-channel intrinsic transistor.

20. A voltage booster circuit as claimed in claim 17, wherein said output voltage of said first and second driver circuits defines first and second kick signals which are at the high state so as to boost the wordline supply node to a boosted level during the read mode.

* * * * *

UNITED STATES PATENT AND TRADEMARK OFFICE
CERTIFICATE OF CORRECTION

PATENT NO. : 5,708,387
DATED : January 13, 1998
INVENTOR(S) : Lee E. Cleveland et al.

It is certified that error appears in the above-indentified patent and that said Letters Patent is hereby corrected as shown below:

Column 7, line 5, change "VKICE" to -- VKICK --;

Column 9, line 66, change "Cn" to -- $C_L$ --;

Column 9, line 67, change "Cn" to -- $C_L$ --.

Signed and Sealed this

Twenty-fourth Day of March, 1998

Attest:

BRUCE LEHMAN

Attesting Officer

Commissioner of Patents and Trademarks